(12) United States Patent
Imai et al.

(10) Patent No.: US 12,721,056 B2
(45) Date of Patent: Aug. 25, 2026

(54) GROUP-III ELEMENT NITRIDE SEMICONDUCTOR SUBSTRATE

(71) Applicant: NGK INSULATORS, LTD., Nagoya (JP)

(72) Inventors: Katsuhiro Imai, Nagoya (JP); Tomohiko Sugiyama, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 481 days.

(21) Appl. No.: 18/344,974

(22) Filed: Jun. 30, 2023

(65) Prior Publication Data

US 2023/0352298 A1 Nov. 2, 2023

Related U.S. Application Data

(63) Continuation of application No. PCT/JP2022/005022, filed on Feb. 9, 2022.

(30) Foreign Application Priority Data

Feb. 25, 2021 (JP) ................................. 2021-028623

(51) Int. Cl.

*H10P 14/20* (2026.01)
*H10D 62/40* (2025.01)
*H10D 62/57* (2025.01)
*H10P 14/60* (2026.01)

(52) U.S. Cl.

CPC ....... *H10P 14/2908* (2026.01); *H10D 62/405* (2025.01); *H10D 62/57* (2025.01); *H10P 14/2926* (2026.01); *H10P 14/6349* (2026.01)

(58) Field of Classification Search

CPC ......... H01L 21/02389; H01L 21/02293; H01L 21/02433; H10D 62/405; H10D 62/57; H10P 14/2908; H10P 14/6349; H10P 14/2926

See application file for complete search history.

(56) References Cited

U.S. PATENT DOCUMENTS 7,118,813 B2 10/2006 Xu et al.
8,026,523 B2 9/2011 Fujikura
9,343,525 B2 5/2016 Hironaka et al.
10,177,217 B2 1/2019 Iso et al.

(Continued)

FOREIGN PATENT DOCUMENTS

CN 102174712 A 9/2011
EP 2003230 A2 12/2008

(Continued)

OTHER PUBLICATIONS

English Translation of the International Preliminary Report on Patentability, issued in corresponding International Application No. PCT/JP2022/005022, Date of Mailing Sep. 7, 2023 (5 pages).

(Continued)

*Primary Examiner* — Richard A Booth
(74) *Attorney, Agent, or Firm* — FLYNN THIEL, P.C.

(57) ABSTRACT

A Group-III element nitride semiconductor substrate includes: a first surface; and a second surface. The Group-III element nitride semiconductor substrate has a c-plane tilted with respect to a direction of the first surface, and a direction of the tilt falls between a <1-100> direction and a <11-20> direction.

2 Claims, 5 Drawing Sheets

(56) References Cited

U.S. PATENT DOCUMENTS

| | | | | |
|---|---|---|---|---|
| 2002/0105986 | A1* | 8/2002 | Yamasaki | H01S 5/32341 372/45.01 |
| 2005/0104162 | A1* | 5/2005 | Xu | H10D 62/405 257/E29.004 |
| 2005/0208687 | A1 | 9/2005 | Kasai et al. | |
| 2008/0308815 | A1 | 12/2008 | Kasai et al. | |
| 2009/0114943 | A1 | 5/2009 | Fujikura | |
| 2018/0342644 | A1 | 11/2018 | Ueta | |
| 2021/0184003 | A1 | 6/2021 | Horikiri et al. | |

FOREIGN PATENT DOCUMENTS

| | | | |
|---|---|---|---|
| JP | 2000-223743 | A | 8/2000 |
| JP | 2001-158691 | A | 6/2001 |
| JP | 3888374 | B2 | 10/2005 |
| JP | 2007-534159 | A | 11/2007 |
| JP | 2008-56518 | A | 3/2008 |
| JP | 4952547 | B2 | 1/2009 |
| JP | 2009-135441 | A | 6/2009 |
| JP | 5244628 | B2 | 8/2010 |
| JP | 2019-77600 | A | 5/2019 |
| WO | 2014/042054 | A1 | 3/2014 |
| WO | 2016/136552 | A1 | 9/2016 |

OTHER PUBLICATIONS

International Search Report, with English translation, issued in corresponding International Application No. PCT/JP2022/005022, date of mailing Apr. 5, 2022 (5 pages).

Written Opinion of International Searching Authority issued in corresponding International Application No. PCT/JP2022/005022, date of mailing Apr. 5, 2022 (3 pages).

Notice of Reasons for Refusal, with English translation, issued in corresponding Japanese Application No. 2023-502264 dated Oct. 1, 2024 (6 pages).

Office Action, with English translation, issued in corresponding German Application No. 11 2022 001 212.9 dated Feb. 6, 2025 (9 pages).

Notice of Reasons for Refusal, with English translation, issued in corresponding Japanese Application No. 2023-502264 dated Mar. 4, 2025 (8 pages).

Office Action, with English translation, issued in corresponding Chinese Application No. 202280008311.5 dated July 7, 1 2026 (14 pages).

* cited by examiner 3a
2a
1a
3
2
1
3b
1b
A
A
A

10'
100'
20'

5

10
4
100
20

GROUP-III ELEMENT NITRIDE SEMICONDUCTOR SUBSTRATE

CROSS-REFERENCE TO RELATED APPLICATIONS

This application is a continuation under 35 U.S.C. 120 of International Application PCT/JP2022/005022 having the International Filing Date of 9 Feb. 2022 and having the benefit of the earlier filing date of Japanese Application No. 2021-028623, filed on 25 Feb. 2021. Each of the identified applications is fully incorporated herein by reference.

BACKGROUND OF THE INVENTION

1. Field of the Invention

The present invention relates to a Group-III element nitride semiconductor substrate. More specifically, the present invention relates to a Group-III element nitride semiconductor substrate including a first surface and a second surface, in which a direction of the first surface is tilted with respect to a c-plane.

2. Description of the Related Art

Group-III element nitride semiconductor substrates, such as a gallium nitride (GaN) wafer and an aluminum nitride (AlN) wafer, have been used as the substrates of light-emitting devices, such as a light-emitting diode and a semiconductor laser (e.g., Patent Literature 1). In addition, high-frequency devices and power devices using those substrates have been actively developed toward their practical applications.

The Group-III element nitride semiconductor substrate includes a first surface and a second surface. When the first surface is defined as a main surface, and the second surface is defined as a back surface, the main surface is typically a Group-III element polar surface, and the back surface is typically a nitrogen polar surface. An epitaxial crystal may be grown on the main surface, and various devices may be produced thereon.

When a GaN substrate whose main surface direction coincides with its crystal plane (c-plane) is used, in the case where a thin film is grown on its main surface, the surface of the thin film may become wavy and may not necessarily become a smooth flat surface. Accordingly, a device is often made by using a GaN substrate slightly tilted from the c-plane, and growing a thin film thereon. Such slight tilting of a surface from a low-index plane is referred to as "off-cut", such substrate is referred to as "off-cut substrate", and the angle of the tilt is referred to as "off angle". A direction in which the main surface is tilted (off direction) is generally the <1-100> direction (m-axis direction) or <11-20> direction (a-axis direction) of a GaN crystal lattice (Patent Literatures 1 to 3).

CITATION LIST

Patent Literature

[PTL 1] JP 3888374 B2
[PTL 2] JP 4952547 B2
[PTL 3] JP 2019-77600 A

SUMMARY OF THE INVENTION

A Group-III element nitride semiconductor has a hexagonal wurtzite crystal structure. Accordingly, an a-axis and an m-axis become directions having most different characteristics and structures in a c-plane, and crystal growth behavior is also different between the a-axis direction and the m-axis direction. For example, when a crystal of the Group-III element nitride semiconductor is grown in a solution, an m-plane is developed, resulting in a hexagonal bottom shape, in which the a-axis direction corresponds to a vertex of the hexagon, and the m-axis direction corresponds to a side of the hexagon. Accordingly, when the off direction is shifted from the a-axis direction or the m-axis direction in the plane of a Group-III element nitride semiconductor substrate, a behavioral change in crystal growth at the time of epitaxial growth is increased, with the result that a disturbance in morphology and variations in characteristics occur in the plane of the epitaxial film. Meanwhile, the Group-III element nitride semiconductor substrate is often produced by processing a crystal having large warping resulting from heteroepitaxial growth, and hence the off direction is liable to be varied in the plane of the Group-III element nitride semiconductor substrate.

An object of the present invention is to provide a Group-III element nitride semiconductor substrate in which, even when its off direction is varied, a behavioral change in crystal growth at the time of epitaxial growth is small, and hence a disturbance in morphology and variations in characteristics in its plane hardly occur.

A Group-III element nitride semiconductor substrate according to an embodiment of the present invention includes: a first surface; and a second surface. The Group-III element nitride semiconductor substrate has a c-plane tilted with respect to a direction of the first surface, and a direction of the tilt falls between a <1-100> direction and a <11-20> direction.

In one embodiment, the direction of the tilt falls within a range of ±15° with respect to a middle direction between the <1-100> direction and the <11-20> direction.

In one embodiment, the direction of the tilt falls within a range of ±12.5° with respect to a middle direction between the <1-100> direction and the <11-20> direction.

In one embodiment, the direction of the tilt falls within a range of ±7.5° with respect to a middle direction between the <1-100> direction and the <11-20> direction.

In one embodiment, an area of a region occupied by the direction of the tilt is 50% or more with respect to a total area of the first surface.

In one embodiment, the tilt has an angle of from 0.2° to 0.8°.

A Group-III element nitride semiconductor substrate according to another embodiment of the present invention includes: a first surface; and a second surface. The Group-III element nitride semiconductor substrate has a c-plane tilted with respect to a direction of the first surface, the Group-III element nitride semiconductor substrate has an orientation flat parallel to a <11-20> direction, and a direction of the tilt falls within a range of +45°±15° or within a range of −45°±15° or within a range of +135°±15° or within a range of −135°±15° with respect to a <1-100> direction.

In one embodiment, the direction of the tilt falls within a range of +45°±12.5° or within a range of −45°±12.5° or within a range of +135°±12.5° or within a range of −135°±12.5° with respect to the <1-100> direction.

In one embodiment, the direction of the tilt falls within a range of +45°±7.5° or within a range of −45°±7.5° or within a range of +135°±7.5° or within a range of −135°±7.5° with respect to the <1-100> direction.

DESCRIPTION OF THE EMBODIMENTS

Figure 1:
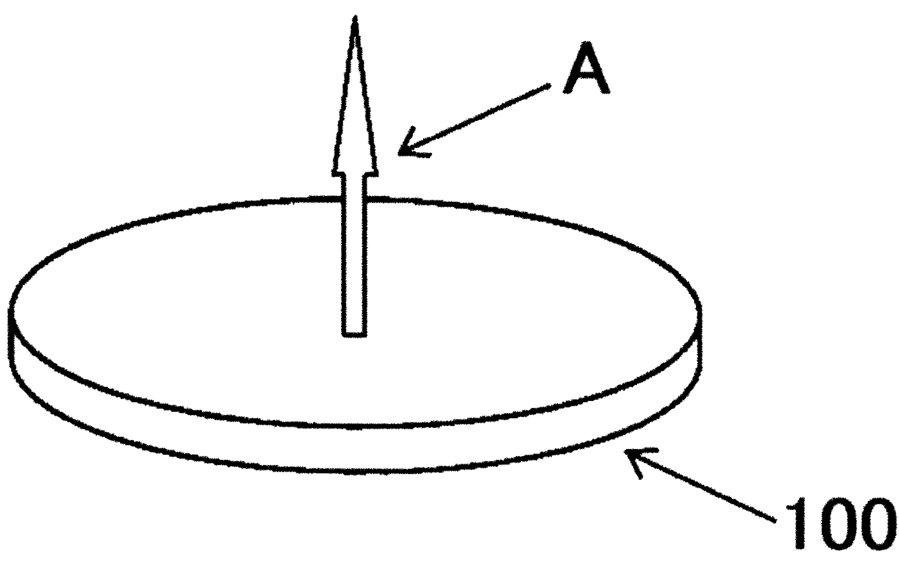
FIG. 1 is a typical schematic perspective view of a Group-III element nitride semiconductor substrate according to an embodiment of the present invention.

When the expression "weight" is used herein, the expression may be replaced with "mass" that is commonly used as an SI unit representing a weight.

A Group-III element nitride semiconductor substrate according to an embodiment of the present invention is typically a freestanding substrate formed of a Group-III element nitride crystal. In the description of the present invention, the term "freestanding substrate" means a substrate that is not deformed or broken by its own weight at the time of its handling, and hence can be handled as a solid. The freestanding substrate may be used as each of the substrates of various semiconductor devices, such as a light-emitting device and a power-controlling device.

The Group-III element nitride semiconductor substrate according to the embodiment of the present invention typically has a wafer shape (substantially complete round shape). However, the substrate may be processed into any other shape such as a rectangular shape as required.

Any appropriate diameter may be adopted as the diameter of the Group-III element nitride semiconductor substrate according to the embodiment of the present invention to the extent that the effect of the present invention is not impaired. The diameter of the Group-III element nitride semiconductor substrate according to the embodiment of the present invention is preferably 50 mm or more, more preferably 75 mm or more, still more preferably 100 mm or more because the effect of the present invention can be expressed to a larger extent. Particularly when the Group-III element nitride semiconductor substrate according to the embodiment of the present invention is a so-called large-diameter Group-III element nitride semiconductor substrate having a diameter of 75 mm or more, the Group-III element nitride semiconductor substrate according to the embodiment of the present invention is easily applied to a high-frequency/high-power electronic device, particularly to such a device for handling large electric power (so-called power device) as to entail an increase in element size.

Specific examples of the large-diameter Group-III element nitride semiconductor substrate include a 4-inch wafer, a 6-inch wafer, an 8-inch wafer, and a 12-inch wafer.

The thickness of the Group-III element nitride semiconductor substrate according to the embodiment of the present invention (when the thickness is not constant, the thickness of a site having the largest thickness) is preferably from 300 μm to 1,000 μm.

Typical examples of the Group-III element nitride include gallium nitride (GaN), aluminum nitride (AlN), indium nitride (InN), and a mixed crystal thereof. Those nitrides may be used alone or in combination thereof.

The Group-III element nitride is specifically GaN, AlN, InN, $Ga_xAl_{1-x}N$ (1>x>0), $Ga_xIn_{1-x}N$ (1>x>0), $Al_xIn_{1-x}N$ (1>x>0), or $Ga_xAl_yIn_zN$ (1>x>0, 1>y>0, x+y+z=1). Those nitrides may be doped with various n-type dopants or p-type dopants.

Typical examples of the p-type dopant include beryllium (Be), magnesium (Mg), strontium (Sr), and cadmium (Cd). Those dopants may be used alone or in combination thereof.

Typical examples of the n-type dopant include silicon (Si), germanium (Ge), tin (Sn), and oxygen (O). Those dopants may be used alone or in combination thereof.

The Group-III element nitride semiconductor substrate according to the embodiment of the present invention is a Group-III element nitride semiconductor substrate including a first surface and a second surface. When the first surface is defined as a main surface, and the second surface is defined as a back surface, as long as the plane direction of the Group-III element nitride semiconductor substrate is on the c-plane side, the main surface is typically a Group-III element polar surface, and the back surface is typically a nitrogen polar surface. However, the main surface may be set to the nitrogen polar surface, and the back surface may be set to the Group-III element polar surface. An epitaxial crystal may be grown on the main surface, and various devices may be produced thereon. The back surface may be held with a susceptor or the like to transfer the Group-III element nitride semiconductor substrate according to the embodiment of the present invention.

In the description of the Group-III element nitride semiconductor substrate according to the embodiment of the present invention, the first surface is described as the main surface, and the second surface is described as the back surface. Accordingly, in this description, the term "main surface" may be replaced with "first surface," the term "first surface" may be replaced with "main surface," the term "back surface" may be replaced with "second surface," and the term "second surface" may be replaced with "back surface."

FIG. 1 is a typical schematic perspective view of a Group-III element nitride semiconductor substrate 100 according to the embodiment of the present invention. As illustrated in FIG. 1, in the Group-III element nitride semiconductor substrate 100 according to the embodiment of the present invention, a plane direction <0001> (c-axis) is tilted with respect to a normal vector A of its first surface. That is, the Group-III element nitride semiconductor substrate 100 according to the embodiment of the present invention is an off-cut substrate having an off angle tilted with respect to the plane direction <0001>.

Figure 2:
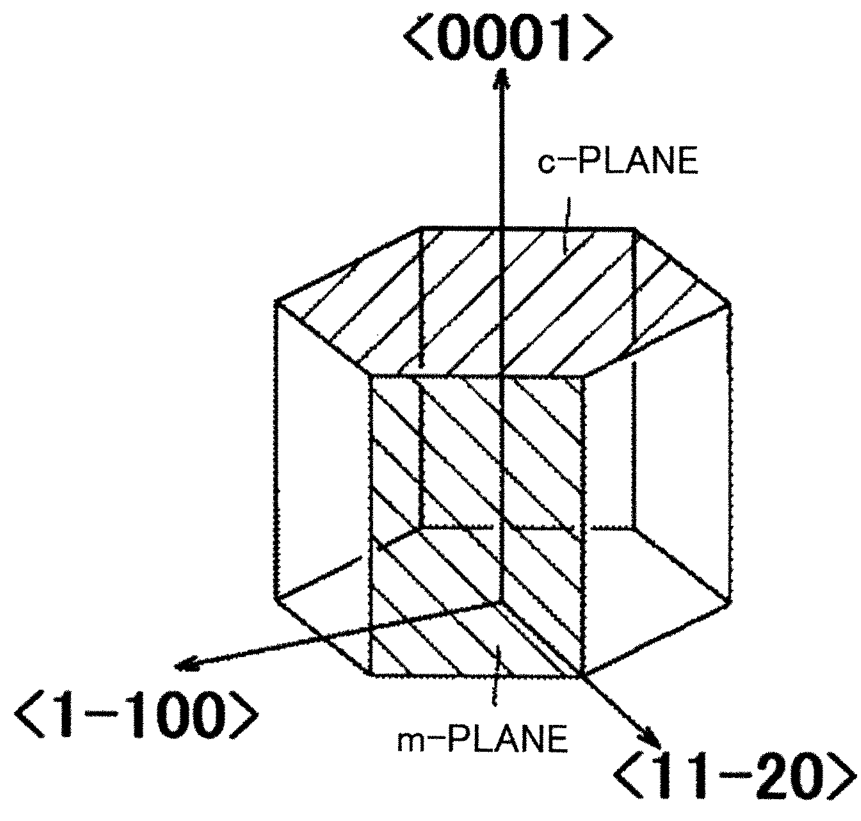
FIG. 2 is a schematic explanatory view for illustrating plane directions and crystal planes in the crystal structure of the Group-III element nitride semiconductor substrate according to the embodiment of the present invention.

FIG. 2 is a schematic explanatory view for illustrating plane directions and crystal planes in the crystal structure of the Group-III element nitride semiconductor substrate according to the embodiment of the present invention. In the crystal structure illustrated in FIG. 2, a <0001> direction is a c-axis direction, a <1-100> direction is an m-axis direction, and a <11-20> direction is an a-axis direction. The top surface of a hexagonal crystal that may be regarded as a regular hexagonal prism is a c-plane, and a side wall surface of the regular hexagonal prism is an m-plane.

In the Group-III element nitride semiconductor substrate according to the embodiment of the present invention, the c-plane is tilted with respect to the direction of the first surface. In other words, in the Group-III element nitride semiconductor substrate according to the embodiment of the present invention, the <0001> direction (c-axis direction) is tilted with respect to the normal vector of the first surface (the normal vector A in FIG. 1).

The angle of the above-mentioned tilt is preferably from 0.2° to 0.8°, more preferably from 0.3° to 0.8°, still more preferably from 0.4° to 0.8°, particularly preferably from 0.5° to 0.7° because the effect of the present invention can be expressed to a larger extent.

In the Group-III element nitride semiconductor substrate according to the embodiment of the present invention, the direction of the above-mentioned tilt falls between the <1-100> direction and the <11-20> direction. That is, in the Group-III element nitride semiconductor substrate according to the embodiment of the present invention, the direction of the tilt (off direction) falls between the m-axis direction and the a-axis direction. In the Group-III element nitride semiconductor substrate according to the embodiment of the present invention, by virtue of the off direction falling between the <1-100> direction and the <11-20> direction as just described, the effect of the present invention can be expressed to a larger extent.

Figure 3:
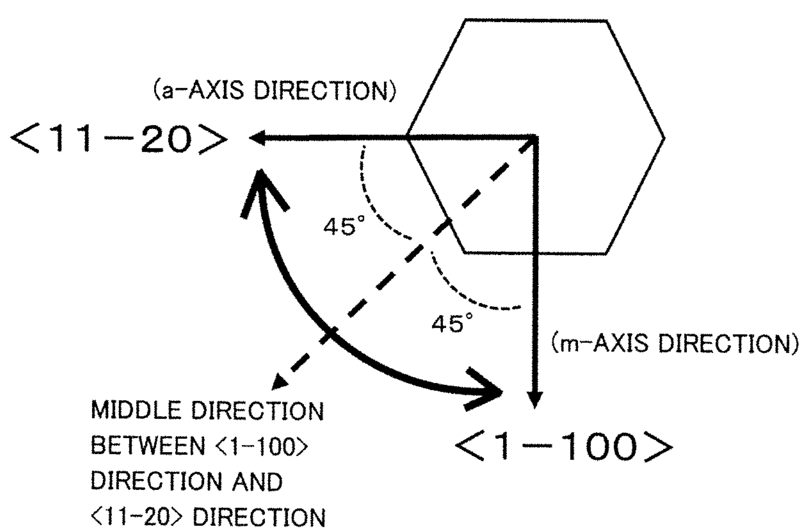
FIG. 3 is a schematic explanatory view for illustrating an off direction in the Group-III element nitride semiconductor substrate according to the embodiment of the present invention.

FIG. 3 is a schematic explanatory view for illustrating the off direction in the Group-III element nitride semiconductor substrate according to the embodiment of the present invention. A conventional Group-III element nitride semiconductor substrate generally has an off direction in the <1-100> direction (m-axis direction) or the <11-20> direction (a-axis direction) as described in the above-mentioned Patent Literatures 1 to 3, whereas the off direction in the Group-III element nitride semiconductor substrate according to the embodiment of the present invention is, as illustrated in FIG. 3, between the <1-100> direction and the <11-20> direction (direction within a range indicated by the solid curved arrow).

In the Group-III element nitride semiconductor substrate according to the embodiment of the present invention, the direction of the above-mentioned tilt preferably falls within the range of ±15° with respect to a middle direction between the <1-100> direction and the <11-20> direction, more preferably falls within the range of ±12.5° with respect to the middle direction between the <1-100> direction and the <11-20> direction, still more preferably falls within the range of ±10° with respect to the middle direction between the <1-100> direction and the <11-20> direction, particularly preferably falls within the range of ±7.5° with respect to the middle direction between the <1-100> direction and the <11-20> direction, and most preferably falls within the range of ±5° with respect to the middle direction between the <1-100> direction and the <11-20> direction because the effect of the present invention can be expressed to a larger extent. Herein, the "middle direction between the <1-100> direction and the <11-20> direction" is a direction at 45° from the <1-100> direction toward the <11-20> direction (or vice versa), and is a direction indicated by the broken line arrow in FIG. 3.

In the Group-III element nitride semiconductor substrate according to the embodiment of the present invention, the area of a region occupied by the direction of the above-mentioned tilt (direction of a tilt falling preferably within the range of ±15° (more preferably within the range of ±12.5°, still more preferably within the range of ±10°, particularly preferably within the range of ±7.5°, most preferably within the range of ±5°) with respect to the middle direction between the <1-100> direction and the <11-20> direction) is preferably 50% or more, more preferably 60% or more, still more preferably 70% or more with respect to the total area of the first surface because the effect of the present invention can be expressed to a larger extent. This means that, in the Group-III element nitride semiconductor substrate according to the embodiment of the present invention, most (preferably 50% or more) of the direction in which the c-plane is tilted with respect to the direction of the first surface falls preferably within the range of ±15° (more preferably within the range of ±12.5°, still more preferably within the range of ±10°, particularly preferably within the range of ±7.5°, most preferably within the range of) ±5° with respect to the middle direction between the <1-100> direction and the <11-20> direction, and the region occupied by the direction of the tilt is preferably large (its ratio is more preferably 60% or more, still more preferably 70% or more). The upper limit value of the ratio of the area of the region occupied by the direction of the tilt (direction of a tilt falling preferably within the range of ±15° (more preferably within the range of ±12.5°, still more preferably within the range of ±10°, particularly preferably within the range of ±7.5°, most preferably within the range of ±5°) with respect to the middle direction between the <1-100> direction and the <11-20> direction) to the total area of the first surface is realistically preferably 100% or less.

In the Group-III element nitride semiconductor substrate according to the embodiment of the present invention, the direction in which the c-plane is tilted with respect to the direction of the first surface at the center of the substrate falls between the <1-100> direction and the <11-20> direction, and preferably falls within the range of ±15° (more preferably within the range of ±12.5°, still more preferably within the range of ±10°, particularly preferably within the range of ±7.5°, most preferably within the range of ±5°) with respect to the middle direction between the <1-100> direction and the <11-20> direction. In the Group-III element nitride semiconductor substrate according to the embodiment of the present invention, as long as most of the direction in which the c-plane is tilted with respect to the direction of the first surface falls within the ranges, part of the direction in which the c-plane is tilted with respect to the direction of the first surface may be tilted in the <1-100> direction (m-axis direction) or the <11-20> direction (a-axis direction).

The Group-III element nitride semiconductor substrate according to the embodiment of the present invention may have an orientation flat parallel to the <11-20> direction. In this case, the direction of the above-mentioned tilt falls within the range of +45°±15° or within the range of −45°±15° or within the range of +135°±15° or within the range of −135°±15° with respect to the <1-100> direction because the effect of the present invention can be expressed to a larger extent.

The direction of the above-mentioned tilt preferably falls within the range of +45°±12.5° or within the range of −45°±12.5° or within the range of +135°±12.5° or within the range of −135°±12.5° with respect to the <1-100> direction, more preferably falls within the range of +45°±10° or within the range of −45°±10° or within the range of +135°±10° or within the range of −135°±10° with respect to the <1-100> direction, still more preferably falls within the range of +45°±7.5° or within the range of −45°±7.5° or within the range of +135°±7.5° or within the range of −135°±7.5° with respect to the <1-100> direction, and particularly preferably falls within the range of +45°±5° or within the range of −45°±5° or within the range of +135°±5° or within the range of −135°±5° with respect to the <1-100> direction because the effect of the present invention can be expressed to a still larger extent. Such design may cause the direction of the tilt to fall within the range of ±15° (preferably within the range of ±12.5°, more preferably within the range of ±10°, still more preferably within the range of ±7.5°, particularly preferably within the range of ±5°) with respect to the middle direction between the <1-100> direction and the <11-20> direction.

The mechanism by which the effect of the present invention can be expressed when, in the Group-III element nitride semiconductor substrate according to the embodiment of the present invention, as described above, the c-plane is tilted with respect to the direction of the first surface, and the direction of the tilt falls between the <1-100> direction and the <11-20> direction is conceived to be as described below.

When an epitaxial film is formed on a Group-III element nitride semiconductor whose main surface is the c-plane, the a-plane is not developed in the side surface direction of the film, but the m-plane is easily developed therein. This is because a crystal growth rate in the m-axis direction is lower than that in the a-axis direction.

In the case of a so-called just substrate without an off angle, the growth of the epitaxial film progresses everywhere on the surface of the substrate, and hence uniform crystal growth does not occur. Accordingly, the thickness of the film is liable to be varied, and the unevenness of the epi film is increased.

On the other hand, on a substrate with an off angle, an epitaxial film grows through so-called step-flow growth. In the step-flow growth, a minute step called an atomic step occurs on the substrate, and a raw material (e.g., a metal ion) is precipitated on the substrate in such a manner that the atomic step advances toward the direction in which the off angle is tilted, with the result that a smooth epi film having satisfactory crystallinity is formed.

In the case of an m-axis-off c-plane Group-III element nitride semiconductor substrate, the shape of the atomic step is likely to be flat (linear) when the substrate is seen from above. This is because the progression direction of the atomic step becomes the m-axis direction, resulting in a state in which a developed m-plane advances. Meanwhile, when a difference occurs in advancing rate between atomic steps for some reason (e.g., temperature unevenness or raw material concentration unevenness), there is a tendency that a step having a higher rate progresses faster, and a step having a lower rate progresses slower. The faster step catches up with the slower step to merge therewith, resulting in a feature in that stepped bunching having large steps is liable to occur. In addition, a giant step in which bunchings are combined occurs in some cases. When the bunching or the giant step occurs, unevenness occurs in incorporation of an impurity such as a dopant, which serves as a cause of variations in characteristics of the epi film. In addition, when the m-plane is cleaved in a device production process, a disturbance occurs in the cleavage plane, which serves as a cause of variations in device characteristics.

Meanwhile, in the case of an a-axis-off c-plane Group-III element nitride semiconductor substrate, the atomic step is likely to be uneven when the substrate is seen from above. This is because, although the progression direction of the atomic step becomes the a-axis direction, the a-plane is hardly developed owing to a high crystal growth rate in the a-axis direction. As the a-plane is not developed, the atomic steps do not have a uniform progression direction, and hence a wavy morphology accompanied by waviness is liable to occur. When such wavy morphology occurs, the unevenness of the surface of the epi film is increased to hinder device production.

As is apparent from the foregoing, in the case of the m-axis-off substrate, a smooth epi film can be expected to be formed, but the control of crystal growth conditions is severe so as to prevent the occurrence of bunching. Meanwhile, in the case of the a-axis-off substrate, the progression direction of the step is unstable, and waviness is liable to occur on the epi film.

In the Group-III element nitride semiconductor substrate according to the embodiment of the present invention, as described above, the c-plane is tilted with respect to the direction of the first surface, and the direction of the tilt falls between the <1-100> direction and the <11-20> direction. Accordingly, the off direction is positioned between the m-axis and the a-axis. In that case, first, the progression direction of the atomic step is not parallel to the m-axis, and hence the atomic step does not have a completely linear shape.

Accordingly, a crank portion serving as a starting point from which the step advances occurs appropriately. Consequently, unevenness is not liable to occur in advancing rate of the step, and bunching is not liable to occur. Further, the progression direction of the atomic step has a constant inclination with respect to the a-axis. Accordingly, the atomic step is not liable to meander, and a wavy morphology is not liable to occur. Thus, an epi film with little unevenness can be formed over a wider condition range.

According to the present invention, as described above, a Group-III element nitride semiconductor substrate in which a disturbance in morphology and variations in characteristics in its plane hardly occur can be provided, and hence the yield of a device produced using this substrate can be improved. For example, when a power device including the Group-III element nitride semiconductor substrate of the present invention is produced, unevenness in withstand voltage can be eliminated to improve the yield.

In addition, according to the present invention, crystal growth behaviors that are characteristic of the a-axis direction and the m-axis direction are alleviated, and hence there can be provided a Group-III element nitride semiconductor substrate in which waviness, bunching, and a giant step on the surface of an epitaxial film are suppressed.

Further, according to the present invention, a laser with little loss and satisfactory characteristics can be produced. In the case of an m-axis-off substrate, a disturbance occurs in a cleavage plane owing to the influence of bunching or a giant step. Accordingly, the end surfaces of the laser cannot be formed to be parallel, and hence a loss occurs. In the case of an a-axis-off substrate, waviness accompanying a wavy morphology occurs on the epi film, and hence a loss occurs in the waveguide of the laser. On the other hand, according to the present invention, the end surfaces of the laser can be formed to be approximately parallel, and the waviness of the epi film is also suppressed. Accordingly, a laser with little loss and satisfactory characteristics can be produced.

Figure 4:
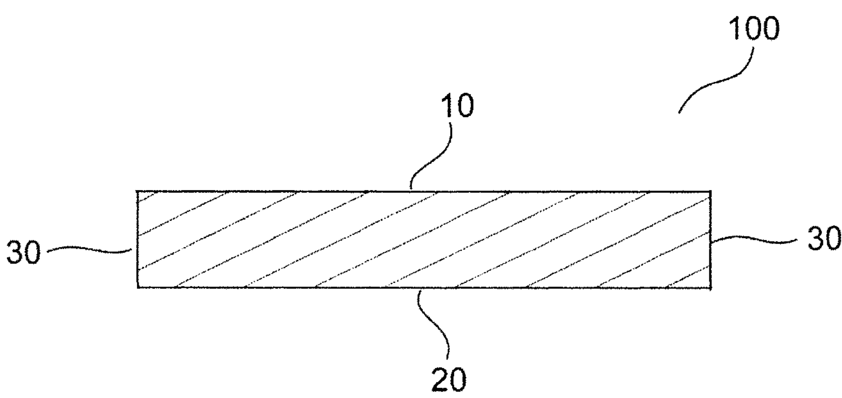
FIG. 4 is a typical schematic sectional view of the Group-III element nitride semiconductor substrate according to the embodiment of the present invention.

FIG. 4 is a typical schematic sectional view of the Group-III element nitride semiconductor substrate according to the embodiment of the present invention. As illustrated in FIG. 4, the Group-III element nitride semiconductor substrate 100 according to the embodiment of the present invention typically has a main surface (Group-III element polar surface) 10 and a back surface (nitrogen polar surface) 20. The Group-III element nitride semiconductor substrate 100 according to the embodiment of the present invention may have a side surface 30.

An end portion of the Group-III element nitride semiconductor substrate according to the embodiment of the present invention may adopt any appropriate form to the extent that the effect of the present invention is not impaired. Examples of the shape of the end portion of the Group-III element nitride semiconductor substrate according to the embodiment of the present invention include: a shape in which chamfered portions on a main surface side and on a back surface side are each chamfered so as to be a flat surface; a shape in which the chamfered portions on the main surface side and on the back surface side are each chamfered in an R-shape; a shape in which only the chamfered portion on the main surface side of the end portion is chamfered so as to be a flat surface; and a shape in which only the chamfered portion on the back surface side of the end portion is chamfered so as to be a flat surface.

When the end portion of the Group-III element nitride semiconductor substrate according to the embodiment of the present invention is chamfered, the chamfered portion may be arranged over the one entire round of an outer peripheral portion, or may be arranged only in part of the outer peripheral portion.

The main surface is preferably a surface from which an affected layer is substantially removed and which has a small surface roughness in a microscopic region from the viewpoint of obtaining a semiconductor device in which devices to be produced by epitaxially growing device layers have satisfactory characteristics and variations in device characteristics between the devices are reduced.

From the above-mentioned viewpoint, the surface roughness (Ra) of the main surface measured in a 90 μm square with an AFM is preferably 1.0 nm or less, more preferably 0.6 nm or less, still more preferably 0.3 nm or less, and the surface roughness (Ra) of the main surface measured in a 10 μm square with an AFM is preferably 0.6 nm or less, more preferably 0.4 nm or less, still more preferably 0.2 nm or less.

The Group-III element nitride semiconductor substrate according to the embodiment of the present invention may be produced by any appropriate method to the extent that the effect of the present invention is not impaired. In terms of expressing the effect of the present invention to a larger extent, a preferred method of producing the Group-III element nitride semiconductor substrate according to the embodiment of the present invention is described below.

Figure 5A:
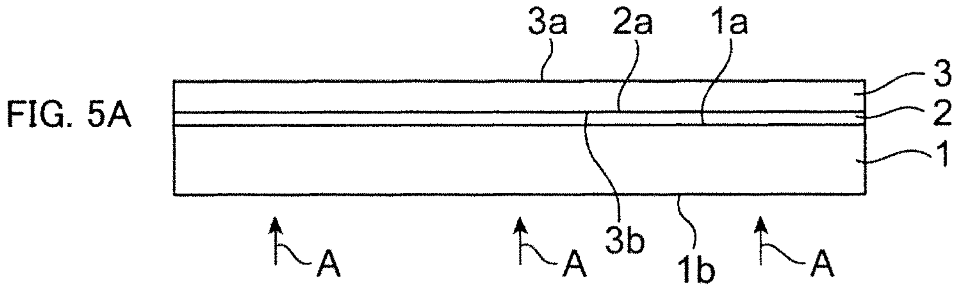
FIGS. 5A to 5C are schematic explanatory views for illustrating a method of producing the Group-III element nitride semiconductor substrate according to the embodiment of the present invention.
Figure 5B:
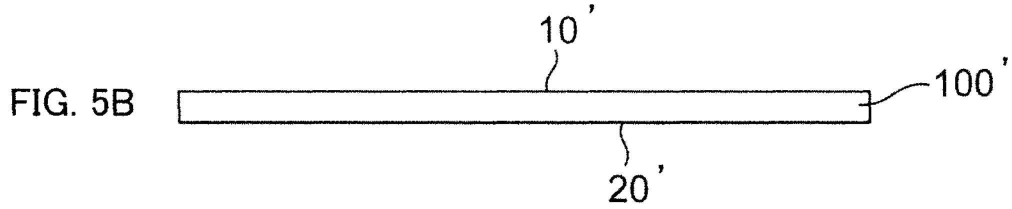

In the Group-III element nitride semiconductor substrate according to the embodiment of the present invention, typically, as illustrated in FIG. 5A, a seed crystal film 2 is formed on a main surface 1*a* of a base substrate 1, and a Group-III element nitride layer 3 is formed on a Group-III element polar surface 2*a* of the seed crystal film 2. Next, a Group-III element nitride layer (seed crystal film 2+Group-III element nitride layer 3) serving as a freestanding substrate is separated from the base substrate 1 to provide a freestanding substrate 100' having a main surface 10' and a back surface 20'.

Any appropriate material may be adopted as a material for the base substrate to the extent that the effect of the present invention is not impaired. Examples of such material include sapphire, crystal oriented alumina, gallium oxide, $Al_xGa_{1-x}N$ ($0 \leq x \leq 1$), GaAs, and SiC.

The off direction of the base substrate is preferably set so that the off direction of a Group-III element nitride grown as a crystal on the base substrate falls between the <1-100> direction (m-axis direction) and the <11-20> direction (a-axis direction) because the Group-III element nitride semiconductor substrate according to the embodiment of the present invention can be efficiently obtained. In the Group-III element nitride semiconductor substrate according to the embodiment of the present invention, the direction of the above-mentioned tilt preferably falls within the range of ±15° with respect to a middle direction between the <1-100> direction and the <11-20> direction of the Group-III element nitride, more preferably falls within the range of ±10° with respect to the middle direction between the <1-100> direction and the <11-20> direction of the Group-III element nitride, and still more preferably falls within the range of ±5° with respect to the middle direction between the <1-100> direction and the <11-20> direction of the Group-III element nitride because the effect of the present invention can be expressed to a larger extent. Herein, the "middle direction between the <1-100> direction and the <11-20> direction" is a direction at 45° from the <1-100> direction toward the <11-20> direction (or vice versa).

As a method of obtaining the base substrate whose main surface is tilted, and whose off direction falls between the <1-100> direction (m-axis direction) and the <11-20> direction (a-axis direction) of the Group-III element nitride grown as a crystal on the base substrate, there are given, for example, a method involving producing a cylindrical boule from a single crystal of a material for a base substrate produced by a pulling method (Czochralski method) in a c-axis direction, deriving a direction inclined from the c-axis direction to a design direction by a predetermined amount by an X-ray diffraction method, and fixing the boule to a predetermined jig, followed by cutting with a wire saw, a method involving producing the base substrate through hollowing-out from a large single crystal produced by the Kyropoulos method, and a method involving producing a plate-shaped single crystal by an EFG method through use of a seed crystal having a predetermined direction, followed by shaping.

However, even when the base substrate whose main surface is tilted, and whose off direction falls between the <1-100> direction (m-axis direction) and the <11-20> direction (a-axis direction) of the Group-III element nitride grown as a crystal on the base substrate is not used, the Group-III element nitride semiconductor substrate according to the embodiment of the present invention can also be efficiently obtained in the following manner: when a freestanding substrate (Group-III element nitride crystal layer) produced as an a-axis-off or m-axis-off substrate is processed into a disc shape, the processing is performed with a tilt in a desired direction.

Any appropriate material may be adopted as a material for the seed crystal film to the extent that the effect of the present invention is not impaired. Examples of such material include $Al_xGa_{1-x}N$ ($0 \leq x \leq 1$) and $In_xGa_{1-x}N$ ($0 \leq x \leq 1$). Of those, gallium nitride is preferred. The material for the seed crystal film is more preferably gallium nitride that is recognized to show a yellow luminescence effect when observed with a fluorescence microscope. The term "yellow luminescence" refers to a peak (yellow luminescence (YL) or a yellow band (YB)) appearing in the range of from 2.2 eV to 2.5 eV in addition to an exciton transition (UV) from a band to another band.

Any appropriate formation method may be adopted as a method of forming the seed crystal film to the extent that the effect of the present invention is not impaired. Such formation method is, for example, a vapor growth method, and preferred examples thereof include a metal-organic chemical vapor deposition (MOCVD) method, a hydride vapor phase epitaxy (HVPE) method, a pulsed excitation deposition (PXD) method, a MBE method, and a sublimation method.

Of those, a metal-organic chemical vapor deposition (MOCVD) method is more preferred as the method of forming the seed crystal film.

The formation of the seed crystal film by the MOCVD method is preferably performed by, for example, depositing a low-temperature grown buffer layer by from 20 nm to 50 nm at from 450° C. to 550° C., and then laminating a film having a thickness of from 2 μm to 4 μm at from 1,000° C. to 1,200° C.

Any appropriate formation method having a crystal direction substantially following the crystal direction of the seed crystal film may be adopted as a method of forming the Group-III element nitride crystal layer to the extent that the effect of the present invention is not impaired. Examples of such formation method include: gas phase growth methods, such as a metal-organic chemical vapor deposition (MOCVD) method, a hydride vapor phase epitaxy (HVPE) method, a pulsed excitation deposition (PXD) method, a molecular-beam epitaxy (MBE) method, and a sublimation method; liquid phase growth methods, such as a Na flux method, an ammonothermal method, a hydrothermal method, and a sol-gel method; a powder growth method utilizing solid phase growth (grain growth) of powder (solid phase growth method); and a combination thereof.

When the Na flux method is adopted as the method of forming the Group-III element nitride crystal layer, the Na flux method is preferably performed in conformity with a production method described in JP 5244628 B2 by appropriately adjusting the conditions and the like so that the effect of the present invention can be expressed to a larger extent.

Next, the freestanding substrate including the Group-III element nitride crystal layer may be obtained by separating the Group-III element nitride crystal layer from the base substrate.

Any appropriate method may be adopted as a method of separating the Group-III element nitride crystal layer from the base substrate to the extent that the effect of the present invention is not impaired. Examples of such method include: a method including spontaneously separating the Group-III element nitride crystal layer from the base substrate through use of a thermal shrinkage difference in a temperature decrease step after the growth of the Group-III element nitride crystal layer; a method including separating the Group-III element nitride crystal layer from the base substrate through chemical etching; a method including peeling the Group-III element nitride crystal layer from the base substrate by a laser lift-off method including applying laser light from a back surface 1*b* side of the base substrate 1 as indicated by the arrows A, as illustrated in FIG. 5A; and a method of peeling the Group-III element nitride crystal layer from the base substrate through grinding. In addition, the freestanding substrate including the Group-III element nitride crystal layer may be obtained by slicing the Group-III element nitride crystal layer through utilization of a wire saw or the like.

Next, the freestanding substrate is shaped into a circular shape having a desired diameter by grinding its outer peripheral portion.

Any appropriate size may be adopted as the size of the freestanding substrate to the extent that the effect of the present invention is not impaired. Such size is, for example, 25 mm (about 1 inch), from 45 mm to 55 mm (about 2 inches), from 95 mm to 105 mm (about 4 inches), from 145 mm to 155 mm (about 6 inches), from 195 mm to 205 mm (about 8 inches), or from 295 mm to 305 mm (about 12 inches).

Next, the main surface and/or the back surface is subjected to removal processing by surface processing, such as grinding, lapping, or polishing, to thereby provide a freestanding substrate turned into a thin plate having a desired thickness and flattened.

When the surface processing, such as grinding, lapping, or polishing is performed, the freestanding substrate is generally bonded to a surface plate for processing, for example, through use of a wax. At this time, a bonding pressure of the freestanding substrate to the surface plate for processing, specifically, a pressure applied to the freestanding substrate at the time of the bonding of the freestanding substrate to the surface plate for processing is appropriately adjusted.

The thickness of the freestanding substrate after the polishing (when the thickness is not constant, the thickness of a site having the largest thickness) is preferably from 300 μm to 1,000 μm.

The outer peripheral edge of the freestanding substrate is chamfered through grinding as required. When the affected layer remains on the main surface, the affected layer is substantially removed. In addition, when a residual stress resulting from the affected layer remains on the back surface, the residual stress is removed. Finally, the Group-III element nitride semiconductor substrate 100 according to the embodiment of the present invention is obtained.

In the Group-III element nitride semiconductor substrate according to the embodiment of the present invention, the chamfering may be performed by any appropriate chamfering method to the extent that the effect of the present invention is not impaired. Examples of such chamfering method include: grinding with diamond abrasive grains; polishing with a tape; and chemical mechanical polish (CMP) with a slurry such as colloidal silica and a polishing pad made of a nonwoven fabric.

Figure 5C:
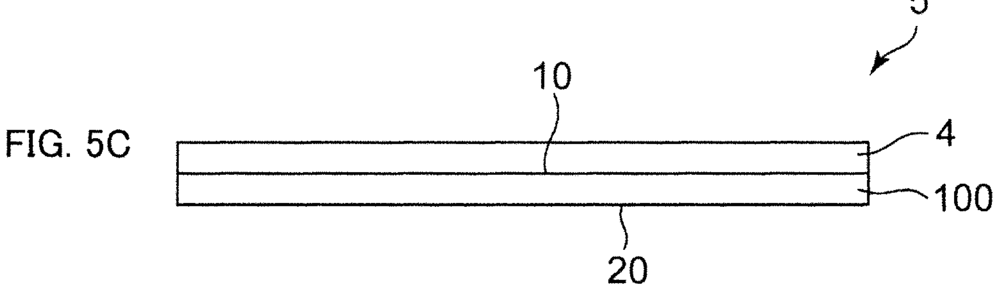

A crystal can be epitaxially grown on the main surface (Group-III element polar surface) 10 of the Group-III element nitride semiconductor substrate 100 to be obtained, and the formation of a functional layer 4 as illustrated in FIG. 5C provides a functional element 5. Reference numeral 20 represents the back surface (nitrogen polar surface) of the substrate.

The epitaxial crystal to be grown on the Group-III element nitride semiconductor substrate to be obtained may be, for example, gallium nitride, aluminum nitride, indium nitride, or a mixed crystal thereof. Specific examples of such epitaxial crystal include GaN, AlN, InN, $Ga_xAl_{1-x}N$ ($1>x>0$), $Ga_xIn_{1-x}N$ ($1>x>0$), $Al_xIn_{1-x}N$ ($1>x>0$), and $Ga_xAl_yIn_zN$ ($1>x>0$, $1>y>0$, $x+y+z=1$). In addition, examples of the functional layer to be arranged on the Group-III element nitride semiconductor substrate to be obtained include a rectifying element layer, a switching element layer, and a power semiconductor layer in addition to a light-emitting layer. In addition, the thickness and total thickness variation of the freestanding substrate may be reduced by subjecting the nitrogen polar surface to processing, such as grinding or polishing, after the arrangement of the functional layer on the Group-III element polar surface of the Group-III element nitride semiconductor substrate to be obtained.

EXAMPLES

The present invention is specifically described below by way of Examples. However, the present invention is by no means limited to Examples. Test and evaluation methods in Examples and the like are as described below. The term "part(s)" in the following description means "part(s) by weight" unless otherwise specified, and the term "%" in the following description means "wt %" unless otherwise specified.

<Measurement of Off Angle and Off Direction>

Measurement was performed with an energy-dispersive X-ray diffractometer (manufactured by Bruker AXS, D2 CRYSO). A diffraction peak due to the (0002) plane of a Group-III element nitride semiconductor having a hexagonal unit lattice was used for the measurement of an off angle. A diffraction peak of the (10-15) plane of the Group-III element nitride semiconductor having a hexagonal unit lattice was used for the measurement of a crystal direction and an off direction. An angle relationship between the direction in which the off angle became maximum, that is, the tilt direction of a c-plane with respect to a main surface, and the crystal direction in the c-plane was measured, and a <1-100> direction and a <11-20> direction were determined so as to have interposed therebetween the direction in which the off angle became maximum. Those directions may also be described as [1-100] and [11-20], respectively, and are directions that are parallel to an m-axis and an a-axis, respectively, and are perpendicular to each other. When pluralities of <1-100> directions and <11-20> directions having interposed therebetween the direction in which the off angle became maximum were determined, the respective directions were determined so that the direction in which the off angle became maximum was close to the middle between the two directions.

<Observation of Bunching and Wavy Morphology>

The surface morphology of an epitaxial film was observed with a differential interference contrast microscope (manufactured by Leica, model number: DM8000M) at a magnification of 100, 200, or 500.

<Observation and Surface Roughness (Ra) Measurement with AFM>

Observation and measurement were performed with an atomic force microscope (AFM). A measurement range was set to a 90 μm square or a 10 μm square.

Example 1

A 6-inch sapphire substrate whose main surface had a direction tilted by 0.5° with respect to the c-plane was produced by a method involving producing a cylindrical boule from a sapphire single crystal produced by a pulling method (Czochralski method) in a c-axis direction, deriving a direction inclined from the c-axis direction toward a design direction by a predetermined amount by an X-ray diffraction method, and fixing the boule to a predetermined jig, followed by cutting with a wire saw. The direction of the tilt of the main surface (direction of the off angle) was set to be in the exact middle between the a-axis and the m-axis. Specifically, the direction is a direction rotated from the <11-20> direction toward the <1-100> direction by 45° in the c-plane.

A seed crystal film made of gallium nitride having a thickness of 2 μm was formed on the produced sapphire substrate by a MOCVD method to provide a seed crystal substrate.

The resultant seed crystal substrate was arranged in an alumina crucible in a glove box under a nitrogen atmosphere.

Next, metal gallium and metal sodium were loaded into the crucible so that the following ratio was obtained: Ga/(Ga+Na) (mol %)=15 mol %. The crucible was loaded into a container made of a heat resistant metal, and the container was then placed on a table on which a crystal growing furnace was able to be rotated. After the temperature and pressure of the crystal growing furnace were increased to 870° C. and 4.0 MPa, respectively, while this state was retained for 100 hours, a solution was stirred by rotating the container, to thereby grow a crystal. After that, annealing was performed to room temperature, and the pressure was reduced to atmospheric pressure. After that, the growing container was taken out from the crystal growing furnace.

Solidified metal sodium in the crucible was removed by being washed with an alcohol. Thus, a gallium nitride crystal layer (thickness: 1 mm) without cracks was obtained on the seed crystal substrate.

The base substrate was peeled to separate the gallium nitride crystal layer by a laser lift-off (LLO) method, to thereby provide a gallium nitride freestanding substrate.

The gallium nitride freestanding substrate was shaped into a circular shape having a diameter of 100 mm by grinding the outer peripheral portion of the gallium nitride freestanding substrate.

The resultant freestanding substrate was bonded to a ceramic-made surface plate for processing with a wax, and the Ga polar surface thereof was ground and lapped. The surface was turned into a mirror surface as final finish with diamond abrasive grains each having a grain diameter of 0.1 μm.

Next, the freestanding substrate in which the Ga polar surface had been processed was reversed and fixed to the ceramic-made surface plate for processing with a wax, and the nitrogen polar surface thereof was ground and lapped. The surface was turned into a mirror surface as final finish with diamond abrasive grains each having a grain diameter of 0.1 μm.

Thus, a wafer (1) serving as a gallium nitride freestanding substrate was produced.

The wafer (1) had a thickness of 500 μm.

The off direction of the resultant wafer (1) was evaluated by an X-ray diffraction method. The off angle and off direction in the central portion of the substrate were measured, and as a result, were found to be tilted by 0.6° in a middle direction between the a-axis and the m-axis.

The formation of an epitaxial film was performed with the produced wafer (1) by a MOCVD method. At this time, film formation conditions (temperature, raw material gas flow rate, and time) were adjusted so that the epi film had a thickness of 1 μm.

The surface of the produced epi film was observed with the differential interference contrast microscope. When observed at a magnification of 200, the surface of the epi film showed no clear bunching or wavy morphology. Next, evaluation was performed with the AFM. Evaluation in a field of view measuring 90 μm by 90 μm provided a uniform contrast, and found an Ra of 0.9 nm. Further, when observed in a field of view measuring 10 μm by 10 μm, the surface was observed to have an atomic step, and had an Ra of 0.2 nm.

Example 2

A wafer (2) was produced in the same manner as in Example 1 except that the direction of the tilt of the main surface of the sapphire substrate (direction of the off angle) was set to be tilted in a direction rotated from the <11-20> direction toward the <1-100> direction by 37.5° in the c-plane.

The formation of an epitaxial film was performed with the produced wafer (2) in the same manner as in Example 1.

The surface of the produced epi film was observed with the differential interference contrast microscope. When observed at a magnification of 200, the surface of the epi film showed no clear bunching or wavy morphology. Next, evaluation was performed with the AFM. Evaluation in a field of view measuring 90 μm by 90 μm provided a uniform contrast, and found an Ra of 1.0 nm.

Example 3

A wafer (3) was produced in the same manner as in Example 1 except that the direction of the tilt of the main surface of the sapphire substrate (direction of the off angle) was set to be tilted in a direction rotated from the <11-20> direction toward the <1-100> direction by 57.5° in the c-plane.

The formation of an epitaxial film was performed with the produced wafer (3) in the same manner as in Example 1.

The surface of the produced epi film was observed with the differential interference contrast microscope. When observed at a magnification of 200, the surface of the epi film showed no clear bunching or wavy morphology, but gentle unevenness was observed. Next, evaluation was performed with the AFM. Evaluation in a field of view measuring 90 μm by 90 μm provided a contrast with light shading, and found an Ra of 1.2 nm.

Comparative Example 1

A wafer (C1) was produced in the same manner as in Example 1 except that the direction of the tilt of the main surface of the sapphire substrate (direction of the off angle) was tilted in an a-axis direction.

The formation of an epitaxial film was performed with the produced wafer (C1) in the same manner as in Example 1.

The surface of the produced epi film was observed with the differential interference contrast microscope. When observed at a magnification of 200, the surface of the epi film was observed to have wavy morphology accompanied by waviness. Next, evaluation was performed with the AFM. Evaluation in a field of view measuring 90 μm by 90 μm provided a contrast accompanied by shading corresponding to the waviness, and found an Ra of 1.3 nm.

Comparative Example 2

A wafer (C2) was produced in the same manner as in Example 1 except that the direction of the tilt of the main surface of the sapphire substrate (direction of the off angle) was tilted in an m-axis direction.

The formation of an epitaxial film was performed with the produced GaN substrate in the same manner as in Example 1.

The surface of the produced epi film was observed with the differential interference contrast microscope. When observed at a magnification of 200, the surface of the epi film was observed to have a giant step. Next, evaluation was performed with the AFM. Evaluation in a field of view measuring 90 μm by 90 μm provided a contrast accompanied by shading corresponding to the bunching, and found an Ra of 2.1 nm.

The Group-III element nitride semiconductor substrate according to the embodiment of the present invention may be utilized as each of the substrates of various semiconductor devices.

According to the present invention, the Group-III element nitride semiconductor substrate in which, even when its off direction is varied, a behavioral change in crystal growth at the time of epitaxial growth is small, and hence a disturbance in morphology and variations in characteristics in its plane hardly occur, can be provided.

Many other modifications will be apparent to and be readily practiced by those skilled in the art without departing from the scope and spirit of the invention. It should therefore be understood that the scope of the appended claims is not intended to be limited by the details of the description but should rather be broadly construed.

What is claimed is:

1. A Group-III element nitride semiconductor substrate, comprising:

a first surface; and a second surface, wherein the Group-III element nitride semiconductor substrate has a c-plane tilted with respect to a direction of the first surface, wherein the Group-III element nitride semiconductor substrate has an orientation flat parallel to a <11-20> direction, wherein the direction of the tilt falls within a range of +45°±12.5° or within a range of −45°±12.5° or within a range of +135°±12.5° or within a range of −135°±12.5° with respect to the <1-100> direction, wherein the tilt has an angle of from 0.2° to 0.8°, wherein the Group-III element nitride semiconductor substrate has a diameter of 75 mm or more, and has a thickness of 300 μm to 1,000 μm, and wherein the surface roughness (Ra) of at least one of the first surface and the second surface measured in a 90 μm square with an AFM is 1.0 nm or less.

2. The Group-III element nitride semiconductor substrate according to claim 1, wherein an area of a region occupied by the direction of the tilt is 50% or more with respect to a total area of the first surface.

* * * * *